United States Patent [19]

Beyerlein

[11] 3,909,838

[45] Sept. 30, 1975

[54] ENCAPSULATED INTEGRATED CIRCUIT AND METHOD

[75] Inventor: Fritz W. Beyerlein, Sunnyvale, Calif.

[73] Assignee: Signetics Corporation, Sunnyvale, Calif.

[22] Filed: Aug. 1, 1973

[21] Appl. No.: 384,629

[52] U.S. Cl. .......................................357/70; 357/72

[51] Int. Cl.$^2$ ......................H01L 29/52; H01L 29/60; H01L 23/28

[58] Field of Search ........... 317/234, 5.4, 3; 357/70, 357/72

[56] References Cited

UNITED STATES PATENTS

| | | | |
|---|---|---|---|
| 3,544,857 | 12/1970 | Byrne et al. | 317/234 |
| 3,617,819 | 11/1971 | Boisvert | 317/234 |
| 3,629,668 | 12/1971 | Hingorany | 317/234 |
| 3,698,074 | 10/1972 | Helda et al. | 29/626 |
| 3,763,404 | 10/1973 | Aird | 317/234 |

*Primary Examiner*—Michael J. Lynch
*Assistant Examiner*—E. Wojciechowicz
*Attorney, Agent, or Firm*—Flehr, Hohbach, Test, Albritton & Herbert

[57] ABSTRACT

An encapsulated integrated circuit having a lead frame comprising a plurality of spaced leads extending outwardly from an inner region. A semiconductor chip is secured to the leads in the inner region. First and second parts formed of an insulating material are disposed on opposite sides of the leads. An adhesive is utilized for binding the first and second parts together with the lead frame to form a unitary assembly which encloses the semiconductor body.

10 Claims, 9 Drawing Figures

ENCAPSULATED INTEGRATED CIRCUIT AND METHOD

BACKGROUND OF THE INVENTION

Encapsulated integrated circuit packages have heretofore been provided as, for example, plastic encapsulation by transfer molding. It has been found that such a package and the method of making the same have several disadvantages. For example, it is a relatively slow process and the material usage is high and wasteful. In addition, there are flashing problems and dam bars must be removed. Also, there are cleaning and curing problems in the presence of tin or other low melting or easily oxidized metals. There is, therefore, a need for a new and improved encapsulated integrated circuit and method for making the same.

SUMMARY OF THE INVENTION AND OBJECTS

The encapsulated integrated circuit comprises a lead frame having a plurality of spaced leads extending outwardly from an inner region. A semiconductor body carrying an integrated circuit is secured to the leads in the inner region. First and second pre-formed parts of an insulating material are disposed on opposite sides of the leads and cover the semiconductor body. An adhesive bonding agent is disposed between said first and second parts and bonds said first and second parts together and to said lead frame to form a unitary assembly which encloses said semiconductor body.

In general, it is an object of the present invention to provide an encapsulated integrated circuit and method which does not require the use of dam bars which later must be removed.

Another object of the invention is to provide an encapsulated integrated circuit and method of the above character in which flashings are not produced on the package which normally must be removed.

Another object of the invention is to provide a method of the above character which substantially reduces the amount of material required.

Another object of the invention is to provide a package of the above character which has a dual in-line form factor.

Another object of the invention is to provide a package and method of the above character which lend themselves to the use of automatic equipment for fibre.

Another object of the invention is to provide a package and method of the above character utilizing a lead frame of metal and first and second pre-formed parts formed of an insulating material.

Another object of the invention is to provide a package and method of the above character in which the lead frame and the parts are provided with cooperative registration means to facilitate alignment during assembly.

Another object of the invention is to provide a package and method of the above character which utilizes inexpensive materials.

Additional objects and features of the invention will appear from the following description in which the preferred embodiment is set forth in detail in conjunction with the accompanying drawing.

DESCRIPTION OF THE PREFERRED EMBODIMENTS

Figure 1:
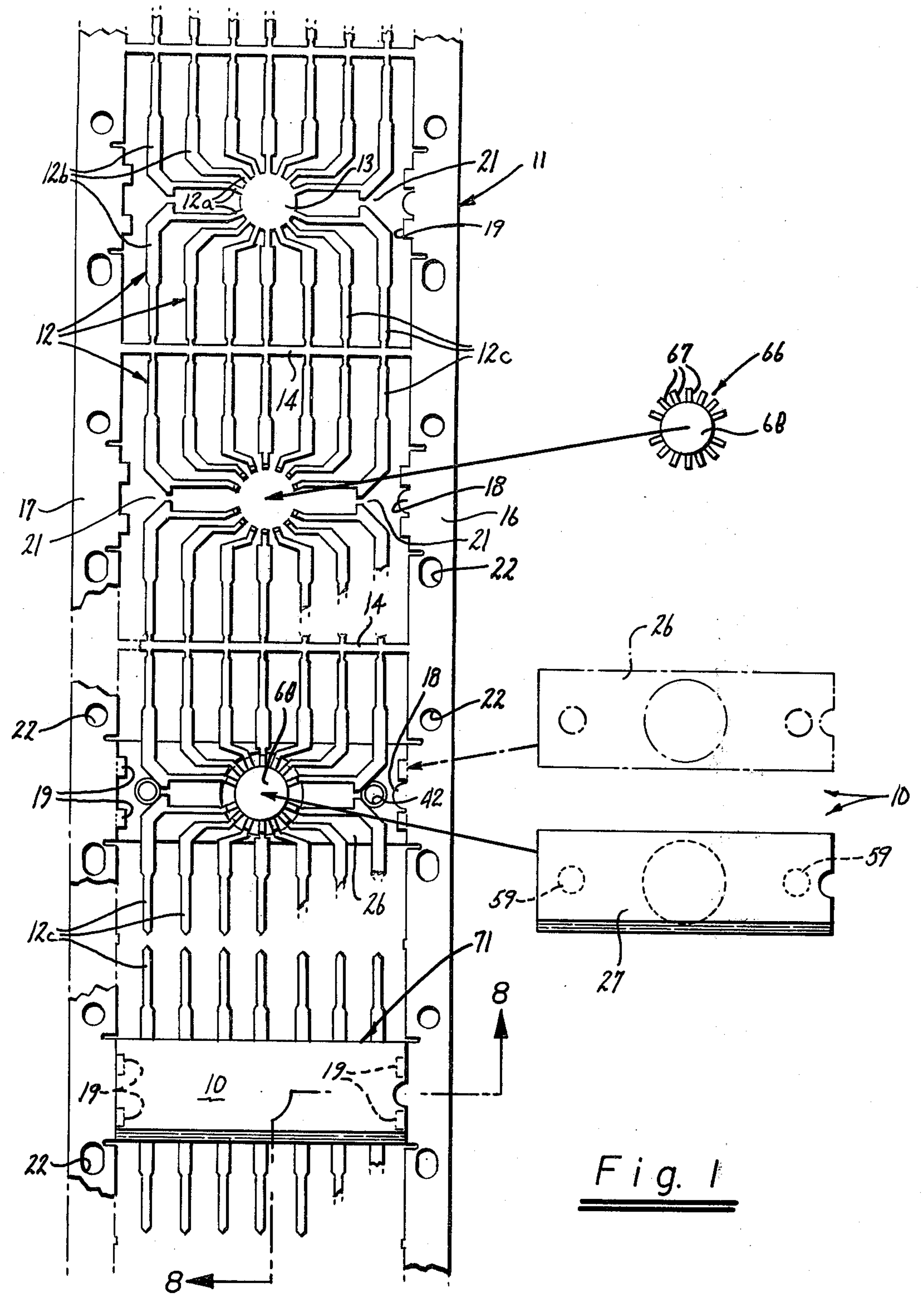
FIG. 1 is a plan view of a lead frame showing the manner in which parts are mounted thereon to form an encapsulated integrated circuit incorporating the present invention.

The integrated circuit package shown in the drawing consists of a lead frame 11 which is somewhat similar to lead frame heretofore used with the exception of several major differences as hereinafter explained. Typically, such a lead frame is made by stamping the same from a sheet of metal. However, other methods such as etching can be utilized if desired. In the present invention, it is desirable to utilize a relatively inexpensive material such as 1010 steel which is plated with a suitable conducting material such as tin. The tin is utilized to prevent corrosion. The lead frame consists of a plurality of spaced leads 12 which extend outwardly from an island or inner region 13 which is generally centrally disposed with respect to the leads 12. The leads are provided with a very narrow portion 12*a* which is connected to the inner region 13. The leads 12 are provided with an intermediate portion 12*b* which is wider than the portion 12*a* and than a narrower portion 12*c*. The portions 12*c* represent the outer extremities of the leads 12 and are formed integral with bars 14 extending at right angles to the leads and which are connected to side members 16 and 17 extending on opposite sides of the leads. The leads 12 are formed as a repetitive pattern in the metal and are disposed between the side members 16 and are carried by the side members 16 and 17. It should be noted that the leads 12 are free between the outer and inner ends and thus no dam is provided in the leads for a reason hereinafter described. For each set of leads 12 forming a lead frame, the side members 16 and 17 are provided with inwardly extending tabs in which side member 16 is provided with a single semicircular tab 18 and a pair of spaced inwardly facing tabs 19 on opposite sides of the tab 18 and side member 17 is also provided with a pair of spaced tabs 19 also facing inwardly. Thus, the tab 18 and tabs 19 face towards each other from the opposite ends of the lead frame. The outermost two leads on the opposite ends of the lead frame form generally V-shaped notches 21 which are used for registration purposes as hereinafter described. The side members 16 and 17 are provided with spaced holes 22 extending longitudinally of the same which are utilized for advancing the lead frames when they are formed as a strip and which can be utilized for advancing the lead frame strip.

Figure 4:
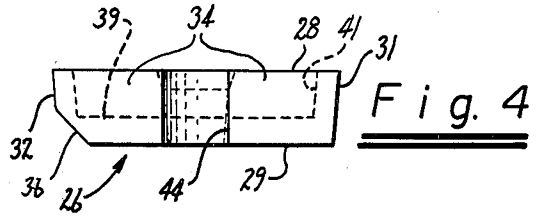
FIG. 4 is a view looking along the line 4—4 of FIG. 2.
Figure 2:
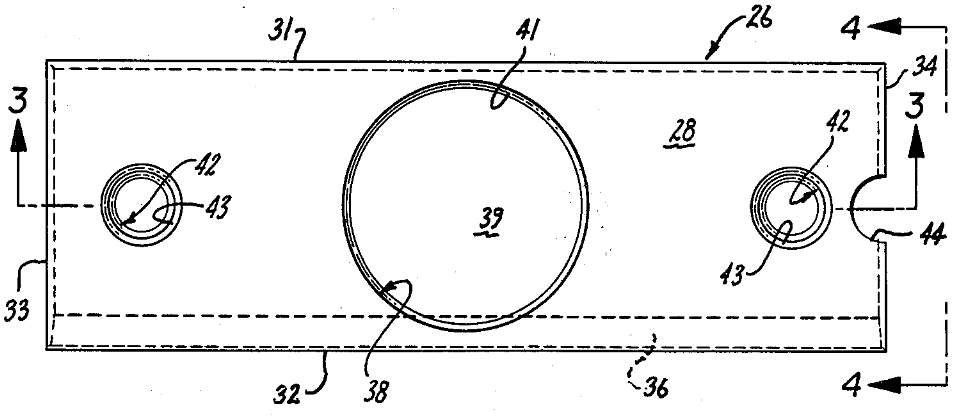
FIG. 2 is a plan view of a bottom part which is utilized in the encapsulated integrated circuit incorporating the present invention.
Figure 3:
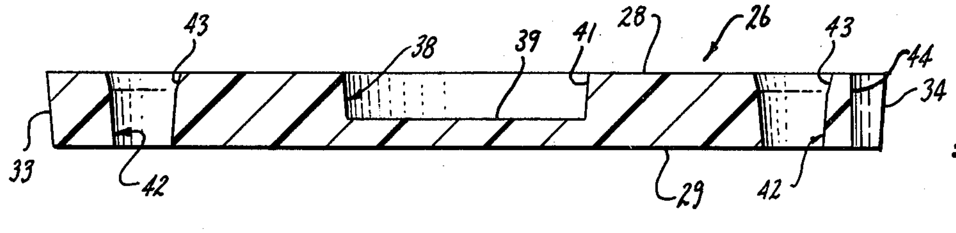
FIG. 3 is a cross sectional view taken along the line 3—3 of FIG. 2.
Figure 8:
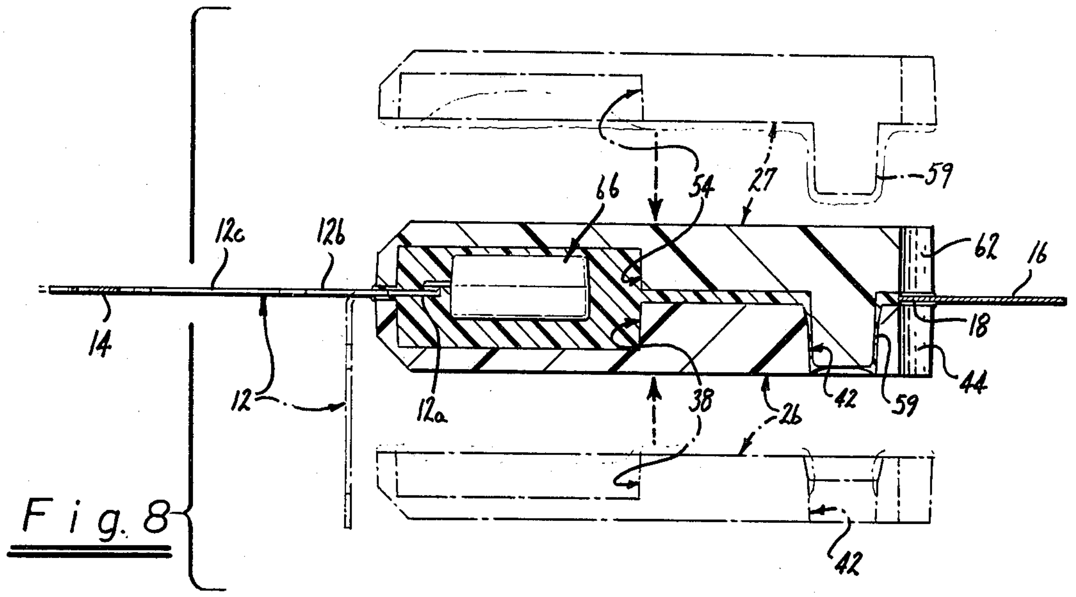
FIG. 8 is a cross sectional view taken along the line 8—8 of FIG. 1 and in addition shows certain of the parts in broken lines to show the method of assembly.
Figure 9:
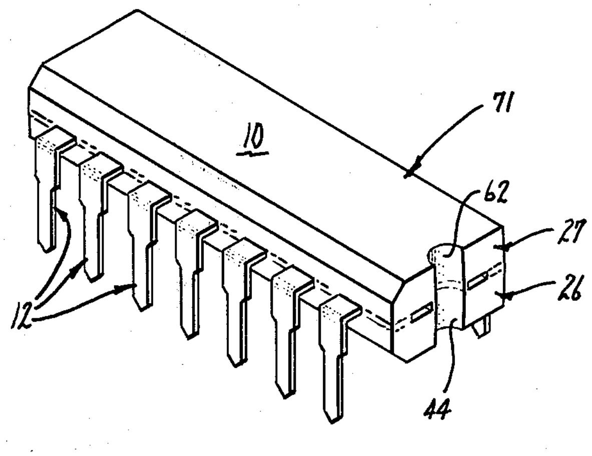
FIG. 9 is an isometric view of the completed encapsulated integrated circuit.

The package 10 also consists of first and second preformed parts 26 and 27 formed of a suitable plastic insulating material such as epoxy or a phenolic resin. The part 26 can be considered as the bottom part and the part 27 as a top part. Both of the parts are generally rectangular. The bottom part is shown in FIGS. 2, 3 and 4. The part 26 is provided with planar top and bottom surfaces 28 and 29 which are parallel to each other. It is also provided with spaced parallel side walls 31 and 32 which are parallel to each other and end walls 33 and 34 which are spaced apart and parallel. As can be seen from the drawings, the side walls 31 and 32 and the end walls 33 and 34 are slightly inclined from the vertical toward the bottom surface. A 45° chamfer 36 is provided in the side wall 32. A centrally disposed dish-shaped recess 38 is formed in the bottom part 26 and extends out through the top surface 28. The recess is formed by a bottom wall 39 which is parallel to the bottom surface 29. The recess is also formed by an upwardly and outwardly inclined side wall 41 which joins the bottom wall 39. A pair of holes 42 are provided in the bottom part 26 on opposite sides of the recess 38 near the end walls 33 and 34 and equi-distant from the side walls 31 and 32. The upper extremities of the holes 43 are defined by a chamfer 43. The end wall 34 is provided with an arcuate recess 44 opening through the end wall and positioned midway between the side surfaces 31 and 32.

Figure 5:
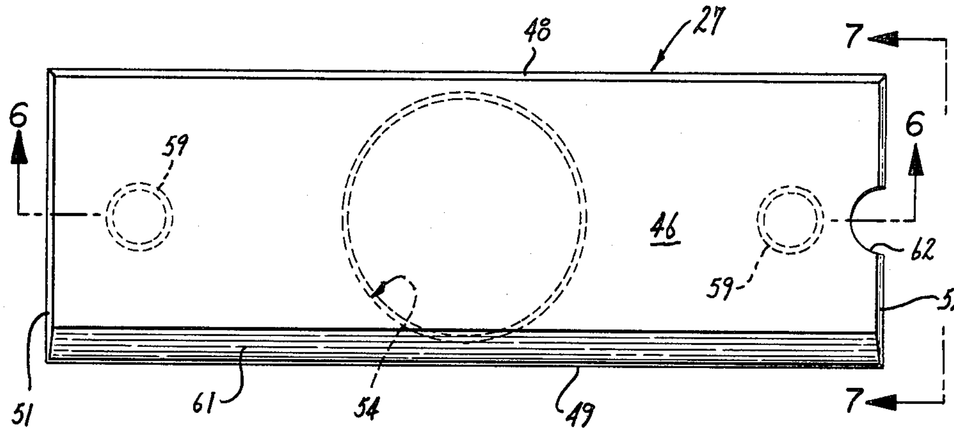
FIG. 5 is a plan view of a top part utilized in the encapsulated integrated circuit incorporating the present invention.
Figure 6:
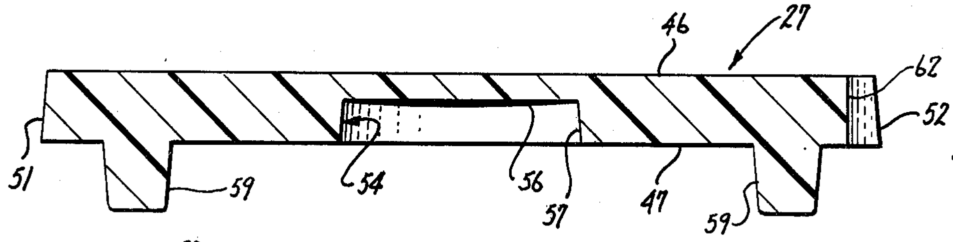
FIG. 6 is a cross sectional view taken along the line 6—6 of FIG. 5.
Figure 7:
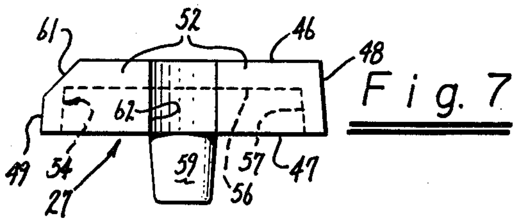
FIG. 7 is a view looking along the line 7—7 of FIG. 5.

The top part is shown in FIGS. 5, 6 and 7, and is provided with a top surface 46 and a bottom surface 47 which are parallel to each other. It is also provided with side surface 48 and 49 and end surfaces 51 and 52. The surfaces 48, 49, 51 and 52 are inclined from the vertical at a suitable angle as, for example, approximately 5°. The part 27 is provided with a centrally disposed recess 54 which is adapted to face the recess 38 provided in the bottom part. The recess 54 is defined by a top wall 56 and an inclined side wall 57. A pair of pins 59 are formed integral with the top part 27 and are disposed on opposite sides of the recess 54 and adjacent the ends of the top part. The pins 59 are positioned in such a manner so that they can mate with the holes 42 provided in the bottom part. As hereinafter described, the pins 59 in cooperation with the holes 42 form cooperative registration means for the bottom and top parts 26 and 27. A chamfer 61 is provided on the wall or surface 49 and extends the length of the same as can be seen in FIG. 5. An arcuate recess 62 is formed in one end of the top part 27 and extends through the surface 52 and is positioned so that it is adapted to register with the corresponding recess 44 in the bottom part 26.

In the method for fabricating the encapsulated integrated circuit, the lead frame 11 is preferably provided in the form of coils which may contain as many as 20,000 to 40,000 parts or repetitions per coil. In each repetition of the pattern in the lead frame, as hereinbefore described, there is provided an island 13 to which the leads 12 are connected. As the lead frame is uncoiled, the center portion or island 13 of the lead frame part is removed in a suitable manner such as by a stamping tool which at the same time forms weld projections on the inner fingertip portions 12a of the leads 12. These weld projections have a knife edge type configuration as described in copending application Ser. No. 293,929, filed Oct. 2, 1972.

After the islands 13 have been removed and the weld projections have been formed on the inner extremities of the leads 12, a pill-like package 66 of the type described in copending application Ser. No. 293,929, filed Oct. 2, 1972 is bonded to the inner extremities of the leads 12. As explained in said copending application Ser. No. 293,929, filed Oct. 2, 1972, the pill-like package consists of a semiconductor body or chip (not shown) which is bonded to a plurality of spider-like leads 67. A body 68 of a suitable insulating material in pill-like form is provided which encapsulates the semiconductor body and the inner extremities of the leads 67 which are connected to pads provided on the semiconductor body. The outer ends of the spider-like leads 67 of each pill are bonded to the inner extremities of the leads 12 in the manner described in copending application Ser. No. 293,929, filed Oct. 2, 1972.

Thereafter, the two pre-molded piece parts or shells 26 and 27 are provided with a suitable adhesive on the inner surfaces 28 and 47, respectively. This adhesive can be of any suitable type which has good adhesion characteristics and which can withstand relatively high heat without distortion. Epoxy and phenolic type adhesive materials can be utilized depending upon the plastic which is used for the piece parts. The adhesives normally would be in the form of a liquid which can be rolled or printed onto the surfaces to which the adhesive is to be supplied. Alternatively, the adhesive could be in sheet form such as a preform which would fit over the pins 59. Another preform can be used for the other part so that one of the preforms would be on opposite sides of the lead frame to be bonded between the two piece parts. Such preforms can be precured in order to obtain fast curing during the process. When utilizing such epoxy and phenolic adhesives, the plastic for the piece parts 26 and 27 could be of the thermosetting type. Alternatively, if desired, the piece parts 26 and 27 can be formed of thermoplastic materials. When this is the case, the two piece parts 26 and 27 can be bonded together and to the lead frame by the use of ultrasonic welding.

It should be appreciated that if the piece parts 26 and 27 are made out of a thermoplastic material such as polypropylene or an epoxy which is partially cured, the parts can be heated in a furnace which will slightly soften the thermoplastic material so that the thermoplastic material would readily flow around the leads 12 to provide an excellent bond when the two parts are brought together around the pill-like package assembly.

In order to obtain good conductivity between the pill-like package 67 and the piece parts 26 and 27, it is desirable to place a suitable liquid plastic such as an epoxy in the recesses 38 and 54 in the piece parts 26 and 27 such as placing a drop of the liquid plastic in each of the recesses. As soon as this has been done and adhesive has been applied to two inner surfaces, the two piece parts 26 and 27 can be brought together automatically or by hand. The part of the lead frame 11 to which the pill-like package 66 has been bonded, is bonded in such a manner that the pill-like package will fit into the recesses 38 and 54 and so that the pins 59 will seat in the recesses 21 provided in the lead frame.

It is desirable that sufficient liquid plastic be placed in the recesses 38 and 54 so that some will be squeezed out when the two parts 26 and 27 are mated with each other about the pill-like package which has been bonded to one of the parts of the lead frame 11. This provides a pill-like package assembly in which the space in the recesses 38 and 54 and between the pill-like package 66 is completely filled.

After the two piece parts 26 and 27 have been pressed together in the manner hereinbefore described, they can be held in this position temporarily by suitable means such as a spring-loaded clip. This assembly 71 can then be cured by the use of heat in a conventional manner such as by placing the same in a belt type furnace or other heating tunnel.

After this operation has been completed and the two piece parts 26 and 27 have been bonded to the pill-like package assembly, the leads 12 are cut from the tie bars 14 in a suitable manner such as by a punch. This serves to electrically isolate the leads 12 so that the semiconductor device or chip carried within the pill-like package 66 can be tested while the assembly 71 is still carried by the lead frame 11. The assembly is supported because the outer extremities of the piece parts engage the tabs 18 and 19 provided on the side members 16 and 17 as shown in FIG. 1. The package assembly 71 can be tested by hand or can be tested with automatic equipment. After the testing has been completed and if the packaged device 71 is satisfactory, it can be readily pushed out of the lead frame 11 and separated from the projecting tabs 18 and 19. Thereafter, the leads can be bent downwardly to provide a conventional configuration as disclosed in copending application Ser. No. 293,929, filed Oct. 2, 1972, which is called a dual in-line package. The package is then ready for use.

It is apparent from the foregoing that there has been provided a new type of encapsulated circuit which is relatively easy to fabricate. There is substantially no wasted material because of the use of pre-molded piece parts. Since these premolded piece parts are utilized, there is no necessity to provide dam bars on the lead frame which is required when injection molding is utilized for encapsulating the pill-like package. In addition, the cleaning and curing problems have been minimized by this type of construction.

I claim:

1. In an encapsulated integrated circuit, a semiconductor body having an integrated circuit formed therein with a plurality of leads connected to the integrated circuit, said leads extending outwardly from the semiconductor body, a body of insulating material encapsulating said semiconductor body and the inner extremities of said leads, an additional lead frame having a plurality of spaced leads with inner and outer extremities, means forming a bond between the inner extremities of the leads of the additional lead frame and the outer extremities of the leads of the first named lead frame, first and second pre-formed parts of a plastic insulating material disposed on opposite sides of the additional leads and means bonding together said first and second parts to provide a unitary assembly enclosing said semiconductor body and the inner extremities of the leads of the additional lead frame.

2. An encapsulated integrated circuit as in claim 1 wherein said means bonding together said first and second parts is in the form of an adhesive.

3. An encapsulated integrated circuit as in claim 1 wherein said first and second parts are provided with cooperative mating means for establishing registration between the parts when they are secured to the leads of the additional lead frame.

4. An encapsulated integrated circuit as in claim 3 wherein said additional lead frame is provided with means cooperating with said cooperative mating means of said parts.

5. An encapsulated integrated circuit as in claim 4 wherein said cooperative mating means includes a pair of spaced pins and wherein said additional lead frame includes means for receiving said pins and for establishing registration between said parts and said additional lead frame.

6. An encapsulated integrated circuit as in claim 1 wherein said body of insulating material is pill-like in form and wherein said parts are provided with recesses adapted to receive said pill-like body.

7. An encapsulated integrated circuit as in claim 6 together with material disposed in said recess so there is substantially no space between said pill-like body and said first and second parts to provide relatively good heat conductivity away from the pill-like body.

8. In a method for fabricating an encapsulated integrated circuit, providing a semiconductor body having a integrated circuit formed therein, securing the inner extremities of a plurality of spaced leads to said semiconductor body, forming a body of insulating material about said semiconductor body and the inner extremities of said leads, securing the inner extremities of a plurality of additional leads to the outer extremities of said first named leads, forming first and second pre-formed parts of plastic insulating material, placing first and second pre-formed parts on opposite sides of the body of insulating material and fastening together said first and second pre-formed parts to bond the same into a unitary assembly enclosing said body of insulating material and the inner extremities of the additional leads.

9. A method as in claim 8 together with the step of forming cooperative mating means in said pre-formed first and second parts so that they will be in registration with each other when the parts are assembled on opposite sides of the body of insulating material.

10. A method as in claim 9 together with the step of forming registration means in the additional leads which are adapted to mate with the cooperative mating means carried by the pre-formed first and second parts.

* * * * *